(12) United States Patent
Sawin

(10) Patent No.: US 6,287,894 B1
(45) Date of Patent: Sep. 11, 2001

(54) ACOUSTIC DEVICE PACKAGED AT WAFER LEVEL

(75) Inventor: Raymond L. Sawin, Collinsville, CT (US)

(73) Assignee: Andersen Laboratories, Inc., Bloomfield, CT (US)

( * ) Notice: Subject to any disclaimer, the term of this patent is extended or adjusted under 35 U.S.C. 154(b) by 0 days.

(21) Appl. No.: 09/411,316

(22) Filed: Oct. 4, 1999

(51) Int. Cl.[7] .................................................. H01L 21/44
(52) U.S. Cl. ......................... 438/113; 438/118; 438/108; 438/464
(58) Field of Search ..................... 438/113, 114, 438/118, 119, 121, 122, 462, 637, 110, 460, 106, 464, 108

(56) References Cited

U.S. PATENT DOCUMENTS

| | | | |
|---|---|---|---|
| 5,438,223 | 8/1995 | Higashi et al. | 257/774 |
| 5,440,240 | 8/1995 | Wood et al. | 324/765 |
| 5,448,014 | 9/1995 | Kong et al. | 174/52.3 |
| 5,686,703 | 11/1997 | Yamaguchi | 174/259 |
| 5,770,305 | 6/1998 | Terasaka | 438/328 |
| 5,831,369 | 11/1998 | Furbacher et al. | 310/313 |
| 5,840,215 | 11/1998 | Iyer et al. | 252/500 |
| 5,851,845 | 12/1998 | Wood et al. | 438/15 |
| 5,879,530 | 3/1999 | Caillat | 205/122 |
| 5,903,056 | 5/1999 | Canning et al. | 257/773 |
| 5,918,113 | 6/1999 | Higashi et al. | 438/119 |
| 6,153,448 | * 11/2000 | Takahashi et al. | 438/114 |

OTHER PUBLICATIONS

Lai, "Anisotropically Conductive Adhesive Flip Chip Bonding on Rlgid and Flexible Printed Circuit Substrates",vol. 19, Aug. 1996, pp. 644–660.*

Lai, Zonghe et al., Anisotropically Conductive Adhesive Flip–Chip Bonding on Rigid and Flexible Printed Circuit Substrates, IEEE Transactions on Components, Packaging and Manufacturing Technology, Aug. 1996.

Chung, Kevin et al., Z–Axis Conductive Adhesive for TAB and Fine Pitch Interconnects, IEEE Transactions, p. 345, 1991.

* cited by examiner

*Primary Examiner*—Charles Bowers
*Assistant Examiner*—Yennhu B. Huynh
(74) *Attorney, Agent, or Firm*—Bernhard P. Molldrem, Jr.

(57) ABSTRACT

Acoustic wave devices are fabricated and packaged together while in wafer form. The devices are formed as dies on a first wafer, which may be quartz crystal. A second wafer, e.g., of alumina or another ceramic, has vias formed in it at positions that correspond to the locations of metallic bus bars on the first wafer, and a grid of an anisotropic conductive thermoplastic material is applied onto the second wafer. The two wafers are laminated, and treated with pressure and heat. The anisotropic conductive material seals the dies, and also connects the die bus bars through the vias to outside conductors. A thin passivation layer, e.g., $SiO_2$, may provide hermetic sealing of the sensitive areas of the die. The devices may be tested robotically in wafer form before singulation.

14 Claims, 2 Drawing Sheets

ACOUSTIC DEVICE PACKAGED AT WAFER LEVEL

BACKGROUND OF THE INVENTION

The present invention relates to acoustic wave devices, such as SAW devices, which are useful e.g. as filters and oscillators, and is more particularly directed to a technique of packaging these devices which is both economical and rugged. The technique is also applicable to other electronic devices.

The invention is more specifically with a technique for creating acoustic devices and packaging the same at the wafer level before singulation or dicing. This permits the devices to be packaged and tested before they are singulated into individual units, thus avoiding many of the reasons for high costs in fabrication.

SAW (Surface Acoustic Wave) devices, STW (Surface Transverse Wave) devices, or similar acoustic wave devices are commonly used in various applications, such as in spectral filtering of electronic signals. The most common type of these are the SAW devices. In the SAW device, any of various techniques are used to launch a Rayleigh wave, and subsequently receive it after it has traveled along a predetermined path along a prepared region of a substrate material, such as quartz crystal, lithium niobate, or lithium tantalate. Usually, there are metal electrodes connected to some metallized termination, using wire bonds. The surface along which the acoustic wave travels is quite sensitive, and this sensitivity becomes extreme as the frequency of operation increases. Traditionally, the package in which the device is encapsulated is hermetically sealed.

Currently, SAW devices are placed in pre-made packages of ceramic or metal. This means that the devices themselves are singulated prior to that time and have to be inserted into their individual packages. A spot of mounting adhesive on the underside holds the SAW in place. Typically, a head space of air or nitrogen is provided above the upper surface.

These packages are typically pre-fabricated by an outside supplier. Because each of the dies has to be installed individually into its own package, the step of packaging can be quite costly. Typically, the cost of the finished SAW device is limited by the cost of the package. Also, the degree to which the size of the device can be reduced is also limited by the requirement for head space. It would be advantageous to employ surface-mounted acoustic wave devices in many circuits, both for purposes of miniaturization and to eliminate sources for unwanted signal reflections. However, effective surface mounting has been difficult to achieve with traditional packaging techniques.

One technique for creating and packaging surface acoustic wave devices is described in Kong et al. U.S. Pat. No. 5,448,014. This patent relates to a hermetically sealed flip-chip device, in which dies are formed on a first wafer, and conductive vias are formed through a second wafer. The solder grids are formed on the first wafer. The two wafers are faced against each other and the solder grids are reflowed to join the two wafers. The solder grids serve to connect the conductive terminal pads of the dies to the vias, and also serve to seal the dies between the wafers. The dies are tested at the wafer level, and then saw cut into individual acoustic devices. While the Kong et al. technique does create some efficiencies in the manufacture of these acoustic devices, it nevertheless creates other problems. First, the solder grids used at the periphery of the devices for hermetic sealing create a conductive ring, and can affect the electrical and electromagnetic properties of the die that is encapsulated there. Further, laying down of a solder grid on top of other supporting metallic layers can be complex and expensive. Also, this technique requires a rather precise and even application of heat at a high enough temperature to reflow the solder grid without damaging the dies. Further, because the solder grid both effects electrical connections and creates a hermetic seal, the grid pattern has to be somewhat complex in order to isolate the peripheral solder sealing ring from the solder terminals.

A number of anisotropic conductive adhesive compositions are available for use in connection with electrical or electronic devices, but these have not been employed in the packaging of acoustic wave devices. Basically, an anisotropic conductive material comprises a thermoplastic carrier or matrix, and a large number of electrically conductive particles dispersed in the carrier or matrix. The material can be in a variety of forms, depending on the preference of the manufacturer, such as a film that can be applied as a tape, or a paste or ink that can be applied by thick-film techniques, such as screening or stenciling. The material is sandwiched between an upper substrate and a lower substrate, where there are conductors on the two substrates in registry, i.e., in vertical alignment with one another. Then the sandwiched workpiece is subjected to pressure and heat, and the matrix softens and then sets to join the two substrates. The metallic particles become pressed into the upper and lower conductors, and form a vertical conductive pathway between them, i.e., in the Z direction. On the other hand, the conductive particles remain out of contact in the plane parallel to the two substrates, and do not form conductive paths in the X or Y directions.

The application of anisotropic conductive adhesive materials to packaged acoustic devices could in theory serve both as the sealing means and as the conductive path between the die and the outer electrode conductors. However, the organic matrix or carrier is somewhat permeable to gasses and does not create a completely hermetic seal. In addition, there is some outgassing over time from the organic material itself which may also compromise the surface of the die.

OBJECTS AND SUMMARY OF THE INVENTION

Accordingly, it is an object of this invention to provide a package and packaging technique for an acoustic wave device that avoid the drawbacks of the prior art.

It is another object to provide a packaged SAW or other acoustic device in which an anisotropic conductive adhesive material is employed for encapsulating the devices at the wafer level, thereby avoiding some of the issues that accompany the use of a solder.

It is yet another object to provide a packaging arrangement for the acoustic wave device that provides a hermetic seal of the sensitive die areas, but permits the use of an economic and straightforward application of an anisotropic conductive material.

In accordance with an aspect of the present invention, a novel process is provided for fabrication and packaging of acoustic wave devices at the wafer level before singulation. A first wafer, i.e., a suitable crystal material such as quartz, is patterned with a plurality of active acoustic wave devices that form dies at spaced locations on an upper surface of the first wafer. The active acoustic wave devices on the first wafer are passivated, e.g., by coating portions of the dies but leaving electrode portions of them exposed. Additional metallization can be applied onto these electrode portions. A second wafer of a dielectric material is prepared with conductive vias at locations that correspond to the locations of the electrode portions on the first wafer. A grid of an anisotropic conductive thermoplastic material is applied onto the upper surface of the second wafer so as to have lines that cross the positions of the vias. Then, the first and second wafers are placed together with their upper surfaces against each other and with the vias in registry with said electrode portions. In this position, the grid of anisotropic conductive thermoplastic material is sandwiched between the two wafers. Heat and pressure are applied to the wafers to set said anisotropic conductive thermoplastic material, and this forms the devices, which are still in wafer form. The devices can be tested robotically while the articles remain in wafer form. Then, the wafers can be saw cut, to singulate the encapsulated dies as packaged devices. The vias connect to conductive pads on the outer surface of the second die, so that the resulting packaged devices are surface mounted devices, and can be applied directly onto the traces of a circuit board without need for bond wires. In the interest of economy of manufacture, the SAW product may be handled robotically in wafer form up until the packaging itself is completed. Currently, a manufacturing lithographic mask can be made with 100 patterns, and can potentially yield 100 devices on the wafer using a lithographic process. In this technique, none of the SAW devices is handled individually until the very end of fabrication and packaging. This can bring about a cost savings of up to 75 percent or higher. Also, since there is no separate package into which the SAW filter is placed, this technique yields devices of the smallest possible footprint.

There may be additional devices printed on the ceramic substrate as well, e.g., capacitors or resistors, if needed for a given application.

The above process yields a packaged acoustic wave device, packaged at the wafer level before singulation, in which a first chip has an active acoustic wave devices formed as a die on its upper surface, with the die having a electrode portions. A passivating layer, e.g., a thin sputtered quartz layer, is formed over a portion of the die leaving the electrode portions exposed. A second chip of a dielectric material has conductive vias at locations corresponding to the locations of the electrode portions on the first chip. A grid of an anisotropic conductive thermoplastic material is positioned on the upper surface of said second chip with lines that cross the vias. The first and second chips are positioned with their upper surfaces against each other and with the vias in registry with the electrode portions. The anisotropic conductive thermoplastic material joins said first and second chips and environmentally seals the associated die. The passivating layer seals out the small amount of chemicals that are not kept out by the thermoplastic seal. The anisotropic material, being non-conductive in the X-Y plane, does not affect the electrical properties of the die. A sufficient amount of headspace over the active parts of the die can be achieved by application of metallization on the conductors and by selecting the thickness of the anisotropic conductive thermoplastic material used to form the grid. For example, an overcoat metallization may be applied to the electrode portions of the die, and the anisotropic conductive thermoplastic material can be applied at a film thickness of about 40 to 100 microns.

The above and many other objects, features, and advantages of this invention will become apparent to persons skilled in the art from the ensuing description of a preferred embodiment, which is to be read in conjunction with the accompanying Drawing.

DETAILED DESCRIPTION OF THE PREFERRED EMBODIMENTS

Figure 1:
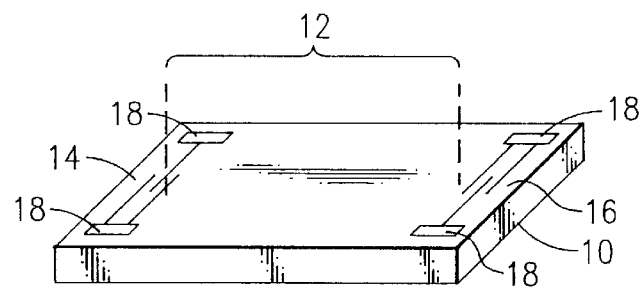
FIG. 1 is a perspective view of a chip of material carrying an acoustic wave die thereon.

With reference to the Drawing, FIGS. 1 to 5 thereof illustrate the basic principles of the process of fabricating a packaged acoustic wave device, here as a surface-mounted device, according to the present invention. The device is illustrated as a single die, but in practice the process would be carried out with a multitude of devices on a wafer, with the wafer intact. The process is illustrated as a single element here for purposes of simplifying the description. On the other hand, the invention could be carried out a single chip at a time, or perhaps with a portion of a wafer containing a few chips. While the ensuing description relates to a SAW device, the invention is not limited to such devices, and could apply to other packaged devices. In each case, a wafer, that may contain many electronic or acoustic dies, is attached to a cover wafer that contains conductive vias for contacting to a circuit. A Z-axis conducting resin or epoxy is used for this. The Z-axis resin or epoxy has an organic matrix that contains gold particles or other conductive particles. When the assembly is laminated and cured under heat and pressure, the gold particles contact the conductive pads and vias of the two wafers, which are positioned in alignment in the Z or vertical direction. However, the gold particles do not contact one another in the X-Y plane, and thus do not form any conductive path in the horizontal plane. This feature permits a continuous bead of this material to be used around the perimeter of each die to form a seal without forming a conductive ring, and without shorting between adjacent conductors or traces. One suitable material for this appears to be LZTP 8856, manufactured by A I Technology of Lawrenceville, N.J.

An ideal anisotropic conductive thermoplastic material should have the ability to withstand stress and fatigue, with minimal outgassing, a characteristic pitch of 1 to 5 mils, and bond instantly on reflow.

As shown in FIG. 1, a single SAW device comprises a chip 10 or substrate of a suitable crystalline material, e.g., quartz, carrying a die 12 formed on its upper layer. The crystalline quartz may be cut from a wafer that contains a hundred or more dies, typically about 130 dies. The die is formed of a first set 14 of interlaced electrodes, and a second set 16 of interlaced electrodes, each having respective bus bars 18 formed at the sides, generally as shown. These bus bars can be made with an aluminum base layer, and with additional metallization overcoated with a barrier layer and gold. This can be carried out using industry standard techniques, such as photolithography.

Figure 2:
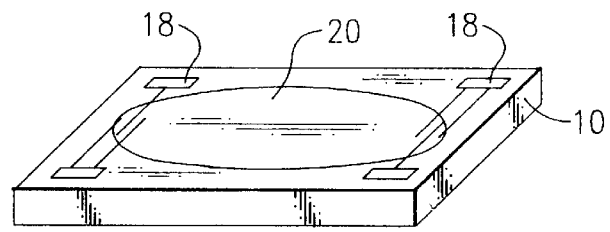
FIG. 2 is another perspective view of the chip, with a passivating layer applied in accordance with one embodiment of the present invention.

A passivation layer 20, i.e., a thin layer of $SiO_2$ (fused quartz) or another low dielectric constant non-conductive material, can be coated over the die 12, as shown in FIG. 2. For example, $SiO_2$ can be sputter-coated through a shadow mask, to leave the bus bars 18 exposed. The coating 20 can have a thickness of about 200 Å. Alternatively, the entire chip can be coated and then the material can be selectively removed from certain sections, such as the bus bars 18. Other coatings, such as InSb are also possible. The thin passivation layer forms a hermetic seal over the die 12, and permits a lower-quality seal to be used in the later packaging steps, as discussed below.

Figure 3:
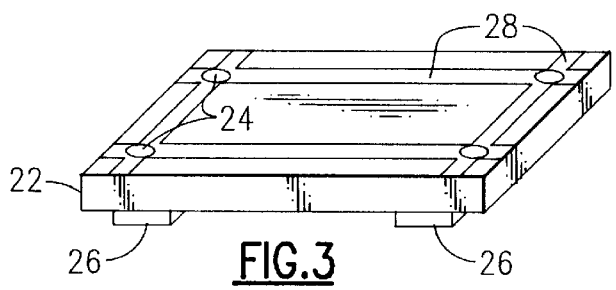
FIG. 3 is a perspective view of a second chip of a dielectric material containing conductive vias and to which a grid of anisotropic conductive thermoplastic material has been applied.

A companion chip 22, as shown in FIG. 3, is prepared for lamination to the chip 10. This chip 22 can be alumina, quartz, another ceramic, or a composite such as circuit board laminate. Various ceramics and glasses can be employed here, and may be fully-fired materials, or may be prepared from green tape and co-fired to produce the chip 22. Here, conductive vias 24 are formed vertically through the companion chip 22 at locations that correspond to the positions of the bus bars 18 of the main chip 10. That is, the vias 24 are at locations that are in vertical alignment with the bus bars 20 when the two chips 10, 22 are positioned together. The vias 24 may be formed by laser-drilling through-holes in the chip 22, and then filling them with a metallization, by electroplating, electroless plating, or vacuum deposition techniques. As an alternative, the vias may be formed in a co-fired chip using conductive inks on green ceramic material. Other materials may be used to create the vias 24. Metal pads 26 are formed on the outer side, i.e., the bottom, of the companion chip 22 in electrical contact with the associated vias 24, and provide for surface mounting of the finished device, as mentioned later.

A pattern or grid 28 of a suitable anisotropic conductive thermoplastic adhesive material is formed, as shown here, such that its lines or stripes cross the vias 24. The material may be in the form of a paste or ink that can be applied using a stencil or silk screen technique. Alternatively, the material may be in the form of a tape or film, i.e., in generally solid form, in which case the pattern may be formed on a release paper and then applied onto the chip 22. The anisotropic conductive material is shown here applied in a rectangular grid 28, but other shapes of grid may be appropriate depending on the chip geometry.

Figure 4:
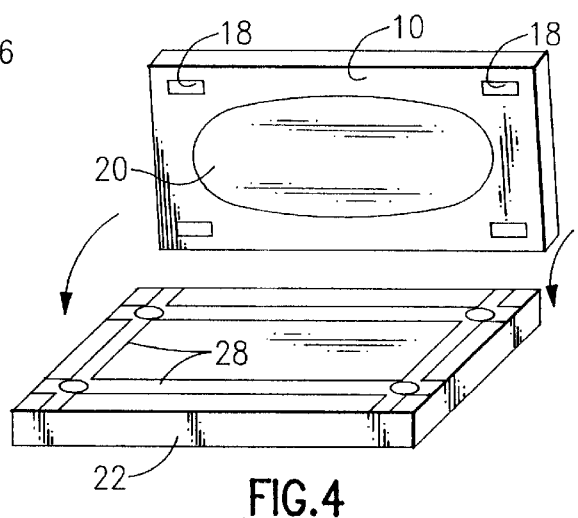
FIG. 4 illustrates a flip-chip assembly technique to form the packaged device according to an embodiment of this invention.

As shown in FIG. 4, the two chips 10 and 22 are laminated by placing them with their upper faces together, i.e., in flip-chip fashion. The two chips are placed in precise alignment, and subjected to a treatment of heat and pressure so that an electrical connection is established through the anisotropic conductive material 28 between the vias 24 and the associated bus bars 18. Typical pressure may be about 10 psi, and a typical temperature may be up to 200° C. The organic matrix of the anisotropic conductive material is compliant and absorbs mechanical stresses without failing, making it superior to solder bonding and having an excellent migration resistance and no bridging for lateral separations down to 5 mils. The grid 28 forms an environmental seal to keep the space between the chips 10 and 22 and within the perimeter of the grid 28 free of dust and particulates and most gases. The passivation layer 20 protects against possibility of gas permeation through the organic matrix and outgassing from the matrix itself. The thickness of the metallization of the bus bars 18 and the vertical or Z-axis thickness of the anisotropic conductive material can be selected to provide a suitable headspace for the die 12. Typically, 40 to 100 microns is sufficient. If additional headspace is required, it is possible to recess the die area of the main chip 10, or to create a recess area in the companion chip 22, or contouring the companion chip 22. However, for most applications, if the material of the companion chip 22 that is just above the active area on the main chip 10 is of a low dielectric constant material, i.e., K=10 or below, only a small headspace is needed.

Figure 5:
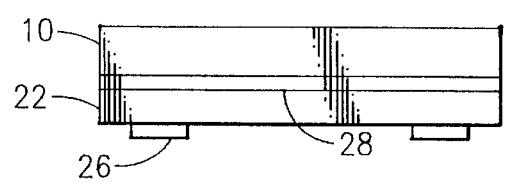
FIG. 5 is an elevational view of the packaged device of this embodiment of the invention.

The resulting packaged device is shown in FIG. 5, in which the anisotropic conductive thermoplastic adhesive material 28 seals the upper and lower chips 10, 22. The electrical connections to the die are achieved through the metal pads 26 on the bottom of the device. The device is leadless, and can be surface mounted Economies of manufacturing a SAW device or other acoustic wave device can be achieved by robotically processing the devices in wafer form up through the steps of packaging and testing, and separating the wafer into individual devices only the very end of the process. An example of the process according to an embodiment of this invention can be explained with reference to FIGS. 6 to 9.

Figure 6:
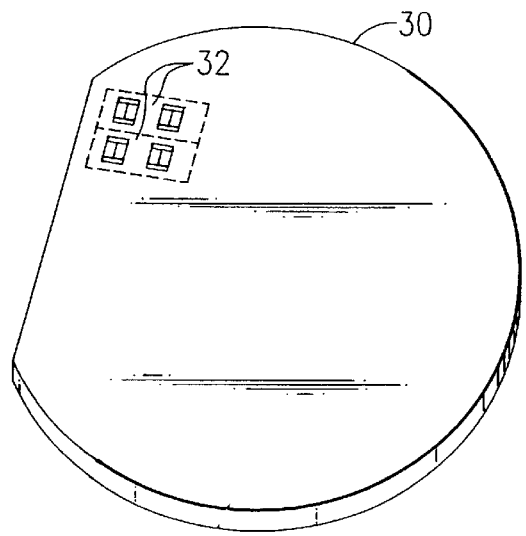
FIG. 6 is a perspective view of a wafer stage on which an array of acoustic wave dies are formed, two of which are shown here, according to an embodiment of the technique of this invention.
Figure 7:
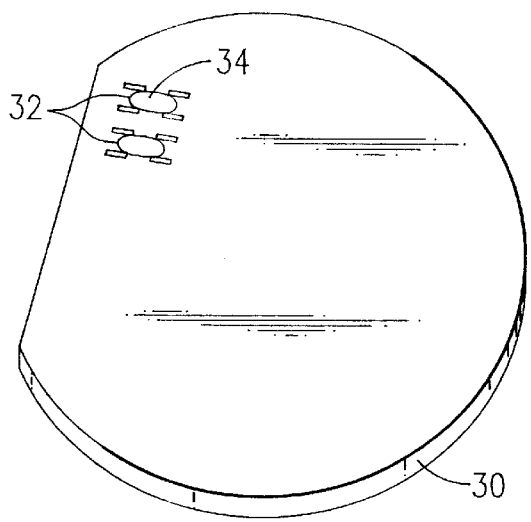
FIG. 7 shows a subsequent step in the technique of this embodiment.

In this process, as shown beginning in FIG. 6, a quartz wafer 30 is patterned to contain a number of distinct SAW die elements 32 formed on its upper surface. Typically, one-hundred-thirty to one-hundred-fifty dies 32 may be formed on a three-inch wafer, but only a two dies 32 are shown in here for clarity. As shown in FIG. 7, a passivation layer 34 is applied, by coating areas of the wafer 30 for example by sputtering $SiO_2$ through a shadow mask. This coats areas of the dies 32 to be hermetic. Bus bar portions of the dies 32 can be overcoated with additional metal.

Figure 8:
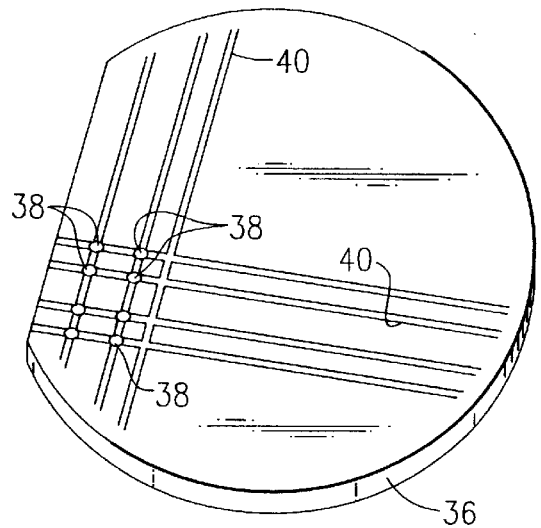
FIG. 8 is a perspective view of a second wafer, showing a grid of anisotropic conductive adhesive applied thereto, according to the technique of this embodiment.
Figure 9:
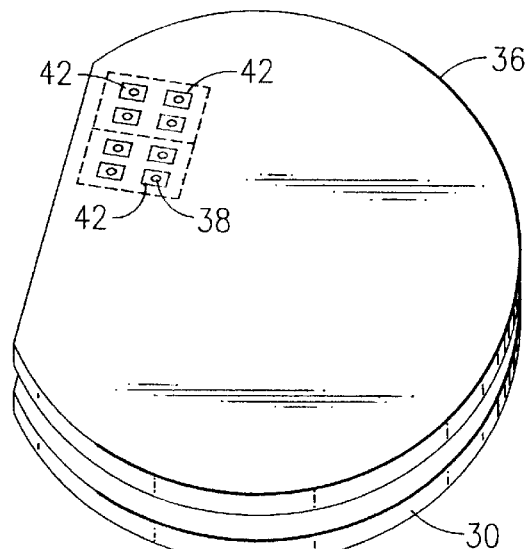
FIG. 9 illustrates the superposition of the second wafer on the first wafer according to this embodiment of the invention.

As shown in FIG. 8, a ceramic companion wafer 36 is prepared, with vias 38 formed therein as conductive pillars which are in positions that correspond to the positions of the conductive bus bars on the first wafer. Conductive pads 42 (FIG. 9) are added on the outer side of the wafer 36 in contact with the associated vias 38. A rectangular grid 40 of anisotropic conductive adhesive is applied by stenciling onto the ceramic companion wafer 36. This grid forms a seal around each individual die 32, and also electrically connects "pinouts" i.e., connects the die bus bars with the associated vias 38 and pads 42. The companion wafer 36 is positioned in alignment with the first wafer 30, and then is subjected to heat and pressure treatment so that the anisotropic conductive adhesive material softens and joins the two wafers.

After this, the dies can be tested robotically while the ceramic wafers are still intact. This is carried out by stepping a testing probe around the wafer 36 to contact the associated pads 42. Then the dies are all robotically marked, again stepping around the wafer. Finally, the devices are saw cut and singulated, producing SAW filter devices ready to mount in circuit. The wafers may be saw cut through the vias 38.

As the die does not have to be separately placed into a pre-fabricated package or shell, the devices that result in this embodiment offer the smallest possible footprint. These may be leadless devices, and can be robotically surface mounted onto conductive traces of a printed circuit.

While the term ceramic has been employed in reference to the wafer 36 the term should be read broadly to include not only alumina and the like, but also vitreous materials and glasses and in some cases including at least some organic or fiber-containing materials.

While the invention has been described in detail with respect to a preferred embodiment, it should be recognized that there are many alternative embodiments that would become apparent to persons of skill in the art. Many modifications and variations are possible which would not depart from the scope and spirit of this invention, as defined in the appended claims.

I claim:

1. Process of manufacturing packaged electronic devices that are packaged at the wafer level before singulation, comprising:

patterning a first wafer with a plurality of active electronic devices forming dies at spaced locations on an upper surface of said first wafer;

passivating said active devices by coating portions of said dies but leaving electrode portions thereof exposed;

preparing a second wafer of a dielectric material with conductive vias at locations corresponding to the locations of the electrode portions on said first wafer;

applying onto an upper surface of said second wafer a grid of an anisotropic conductive thermoplastic material with lines that cross said vias;

placing the first and second wafers with their upper surfaces against each other and with the vias in registry with said electrode portions, and with said anisotropic conductive thermoplastic material therebetween;

applying heat and pressure to said wafers to set said anisotropic conductive thermoplastic material; and singulating said devices as packaged devices.

2. The process of claim 1 wherein said step of passivating includes coating said portions with a fused quartz.

3. The process of claim 1 wherein said step of passivating is carried out by sputtering through a shadow mask.

4. The process of claim 1 wherein said step of singulating is carried out by saw cutting through said vias.

5. The process of claim 1 wherein said grid of anisotropic conductive thermoplastic material is laid out as a rectangular grid.

6. The of process claim 1 wherein said grid of anisotropic conductive thermoplastic material is applied by stenciling.

7. The process of claim 1, wherein said patterning includes forming a plurality of active acoustic wave devices as dies at spaced locations on the upper surface of said first wafer.

8. The process of claim 7, wherein said first wafer is formed of a quartz crystal.

9. Process of manufacturing packaged electronic devices that are packaged at the wafer level before singulation, comprising:

patterning a first wafer with a plurality of active electronic devices forming dies at spaced locations on an upper surface of said first wafer;

passivating said active devices by coating portions of said dies with a thin passivation layer but leaving electrode portions thereof exposed, said passivation layer having a thickness of about 200 Å;

preparing a second wafer of a dielectric material with conductive vias at locations corresponding to the locations of the electrode portions of said first wafer;

applying onto an upper surface of said second wafer a grid of an anisotropic conductive thermoplastic material with lines that cross said vias;

placing the first and second wafers with their upper surfaces against each other and with the vias in registry with said electrode portions, and with said anisotropic conductive thermoplastic material therebetween;

applying heat and pressure to said wafers to set said anisotropic conductive thermoplastic material; and singulating said devices as packaged devices.

10. The process of claim 9 wherein said passivating includes coating with fused quartz.

11. The process of claim 9 wherein said passivating includes coating with InSb.

12. Process of manufacturing packaged electronic devices that are packaged at the wafer level before singulation, comprising:

patterning a first wafer with a plurality of active electronic devices forming dies at spaced locations on an upper surface of said first wafer;

passivating said active devices by coating portions of said dies but leaving electrode portions thereof exposed;

preparing a second wafer of a dielectric material with conductive vias at locations corresponding to the locations of the electrode portions on said first wafer;

applying onto an upper surface of said second wafer a grid of an anisotropic conductive thermoplastic material with lines that cross said vias, said anisotropic conductive thermoplastic material being applied at a predetermined thickness;

placing the first and second wafers with their upper surfaces against each other and with the vias in registry with said electrode portions, and with said anisotropic conductive thermoplastic material therebetween;

applying heat and pressure to said wafers to set said anisotropic conductive thermoplastic material, with the thickness of said anisotropic conductive thermoplastic material being sufficient to leave a suitable headspace between said die and the upper surface of the second wafer; and singulating said devices as packaged devices.

13. The process of claim 12 wherein said headspace is between 40 and 100 microns.

14. The process of claim 12 wherein said preparing the second wafer includes selecting the material of said second wafer to have a dielectric constant of 10 or below.

* * * * *